(12) United States Patent
Lin et al.

(10) Patent No.: US 9,589,815 B2
(45) Date of Patent: Mar. 7, 2017

(54) SEMICONDUCTOR IC PACKAGING METHODS AND STRUCTURES

(71) Applicant: NANTONG FUJITSU MICROELECTRONICS CO., LTD., Nantong (CN)

(72) Inventors: Chang-Ming Lin, Nantong (CN); Lei Shi, Nantong (CN); Xiao-Chun Wu, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 14/074,598

(22) Filed: Nov. 7, 2013

(65) Prior Publication Data

US 2014/0124927 A1 May 8, 2014

(30) Foreign Application Priority Data

Nov. 8, 2012 (CN) .......................... 2012 1 0443748
Nov. 8, 2012 (CN) .......................... 2012 1 0444096

(51) Int. Cl.
*H01L 21/48* (2006.01)
*H01L 23/498* (2006.01)
(Continued)

(52) U.S. Cl.
CPC .......... *H01L 21/4846* (2013.01); *H01L 24/03* (2013.01); *H01L 24/05* (2013.01);
(Continued)

(58) Field of Classification Search
CPC ... H01L 2224/0401; H01L 2224/05017; H01L 2224/05582; H01L 2224/05558;
(Continued)

(56) References Cited

U.S. PATENT DOCUMENTS 6,137,184 A * 10/2000 Ikegami ............. H01L 21/4853
257/734
2002/0056741 A1 5/2002 Shieh et al.
(Continued)

FOREIGN PATENT DOCUMENTS

CN 1132003 A 9/1996
CN 101315915 A 12/2008
(Continued)

*Primary Examiner* — Khiem D Nguyen
*Assistant Examiner* — Pauline Vu
(74) *Attorney, Agent, or Firm* — Anova Law Group, PLLC

(57) ABSTRACT

An IC packaging method is provided. The method includes providing a semiconductor substrate. The semiconductor substrate has a metal pad and an insulating layer and the insulating layer has an opening to expose the meal pad. The method also includes forming an under-the-ball meal electrode on the exposed metal pad. The under-the-ball metal electrode has an electrode body and an electrode tail, the electrode body is located at a bottom portion of the under-the-ball metal electrode and is in contact with the metal pad, and the electrode tail is located at a top portion of the under-the-ball meal electrode. Further, the method includes forming a solder ball on the under-the-ball metal electrode.

16 Claims, 6 Drawing Sheets

(51) Int. Cl.
  *H01L 23/00* (2006.01)
  *H01L 23/525* (2006.01)
  *H01L 23/31* (2006.01)

(52) U.S. Cl.
  CPC .......... *H01L 24/13* (2013.01); *H01L 23/3192* (2013.01); *H01L 23/525* (2013.01); *H01L 24/11* (2013.01); *H01L 2224/0346* (2013.01); *H01L 2224/03464* (2013.01); *H01L 2224/0401* (2013.01); *H01L 2224/05017* (2013.01); *H01L 2224/05139* (2013.01); *H01L 2224/05144* (2013.01); *H01L 2224/05147* (2013.01); *H01L 2224/05558* (2013.01); *H01L 2224/05582* (2013.01); *H01L 2224/05611* (2013.01); *H01L 2224/05639* (2013.01); *H01L 2224/05644* (2013.01); *H01L 2224/05655* (2013.01); *H01L 2224/1132* (2013.01); *H01L 2224/1134* (2013.01); *H01L 2224/11849* (2013.01); *H01L 2224/131* (2013.01); *H01L 2224/13017* (2013.01); *H01L 2224/13018* (2013.01); *H01L 2224/13019* (2013.01); *H01L 2224/13024* (2013.01); *H01L 2224/13076* (2013.01); *H01L 2224/13111* (2013.01); *H01L 2224/13562* (2013.01); *H01L 2224/13582* (2013.01); *H01L 2224/94* (2013.01)

(58) Field of Classification Search
  CPC ............. H01L 2224/94; H01L 23/3192; H01L 23/525; H01L 24/02–24/17; H01L 2224/0346; H01L 2224/03462; H01L 2224/03464; H01L 21/4846
  See application file for complete search history.

(56) References Cited

U.S. PATENT DOCUMENTS

| | | | | |
|---|---|---|---|---|
| 2003/0211720 | A1* | 11/2003 | Huang | H01L 23/3114 438/613 |
| 2006/0246706 | A1* | 11/2006 | Ke | H01L 24/11 438/613 |
| 2007/0045840 | A1* | 3/2007 | Varnau | H01L 24/11 257/737 |
| 2008/0296764 | A1* | 12/2008 | Chang et al. | 257/738 |
| 2009/0079094 | A1* | 3/2009 | Lin | 257/778 |
| 2009/0102050 | A1* | 4/2009 | Hsu | H01L 21/4853 257/738 |
| 2009/0130840 | A1* | 5/2009 | Wang et al. | 438/614 |
| 2010/0290191 | A1* | 11/2010 | Lin | H01L 23/49816 361/704 |
| 2011/0101523 | A1* | 5/2011 | Hwang et al. | 257/737 |
| 2011/0186986 | A1* | 8/2011 | Chuang | H01L 24/11 257/737 |
| 2011/0266670 | A1 | 11/2011 | England et al. | |
| 2012/0006592 | A1* | 1/2012 | Ouchi | H01L 24/03 174/267 |
| 2012/0074578 | A1* | 3/2012 | Kobayashi | H01L 24/11 257/773 |
| 2012/0091577 | A1* | 4/2012 | Hwang et al. | 257/737 |

FOREIGN PATENT DOCUMENTS

| | | | | |
|---|---|---|---|---|
| CN | 101346812 A | | 1/2009 | |
| CN | 101436559 A | | 5/2009 | |
| CN | 102496580 A | | 6/2012 | |
| CN | 102496604 A | | 6/2012 | |
| CN | 102931101 A | * | 2/2013 | ............. H01L 21/48 |
| CN | 202917476 U | | 5/2013 | |
| JP | 07283221 A | * | 10/1995 | ............. H01L 24/11 |

* cited by examiner

SEMICONDUCTOR IC PACKAGING METHODS AND STRUCTURES

CROSS-REFERENCES TO RELATED APPLICATIONS

This application claims the priority of Chinese patent application no. 201210443748.X, filed on Nov. 8, 2012, and Chinese patent application no. 201210444096.1, filed on Nov. 8, 2012, the entire contents of all of which are incorporated herein by reference.

FIELD OF THE INVENTION

The present invention generally relates to semiconductor technologies and, more particularly, to the methods and structures for semiconductor IC packaging.

BACKGROUND

Traditionally, integrated circuit (IC) chips are connected to external circuits by metal wires (wire bonding). However, with the reducing of the feature size of the IC chips and the increasing on the scale of the integrated circuits, such wire bonding technique is no longer applicable.

The wafer level chip scale packaging (WLCSP) is a technology to package the whole wafer and then, after testing, to dice the wafer into individual finished chips. Thus, the packaged chip size and the die are completely consistent. The wafer level chip scale packaging technology is now replacing the traditional packaging technologies such as ceramic leadless chip carrier, organic leadless chip carrier, etc., meeting the market's demands for microelectronic products that are increasingly light, small, short, thin, and inexpensive. Using the wafer level chip scale packaging technology, the chip size can be miniaturized at a high degree, and the cost of the chips decreases significantly with the decreasing chip size and the increasing of wafer size. Thus, the wafer level chip scale packaging technology integrates IC design, wafer manufacturing, packaging and testing, and is a hot spot in the current packaging industry and also a trend for future development.

FIG. 1 shows a cross-section view of a packaging structure using current wafer level chip scale packaging technology. As shown in FIG. 1, the packaging structure includes: a semiconductor substrate 101; a metal pad 103 located inside and outside of the semiconductor substrate 101; and an insulating layer 102 formed on the surface of the semiconductor substrate 101. The insulating layer 102 has an opening exposing the metal pads 103. Within the opening, there a metal electrode 104 covering a portion of the metal pad 103; and a solder ball 105 is located on top of the metal electrode 104 and cover the upper surface of the metal electrode 104.

However, the contact area between the solder ball 105 and the metal electrode 104 is relatively small, and the adhesion between the solder ball 105 and the metal electrode 104 is relatively poor. At the same time, the side of the metal electrode 104 is completely bare, and can be easily oxidized and loses reliable connection to the insulating layer 102. In addition, the solder ball 105 is located directly above the under-the-ball metal electrode 104. Because the under-the-ball metal electrode 104 is typically made of copper and the solder ball 105 is usually made of tin, tin atoms can diffuse into the copper electrode and copper atoms can also diffuse into the solder balls. Thus, intermetallic compound (IMC) and voids may be formed between the solder ball 105 and the metal electrode 104 (solder joint), whose brittleness can also affect the mechanical strength and longevity of the solder joint.

Thus, the current WLCSP chip packaging structure may have a poor reliability. The disclosed methods and systems are directed to solve one or more problems set forth above and other problems.

BRIEF SUMMARY OF THE DISCLOSURE

One aspect of the present disclosure includes an IC packaging method. The method includes providing a semiconductor substrate. The semiconductor substrate has a metal pad and an insulating layer and the insulating layer has an opening to expose the metal pad. The method also includes forming an under-the-ball meal electrode on the exposed metal pad. The under-the-ball metal electrode has an electrode body and an electrode tail, the electrode body is located at a bottom portion of the under-the-ball metal electrode and is in contact with the metal pad, and the electrode tail is located at a top portion of the under-the-ball metal electrode. Further, the method includes forming a solder ball on the under-the-ball metal electrode.

Another aspect of the present disclosure includes an IC packaging structure. The IC package structure includes a semiconductor substrate, a metal pad formed inside the semiconductor substrate, and an insulating layer formed on the semiconductor substrate and having an opening to expose the metal pad. The IC packaging structure also includes an under-the-ball meal electrode formed on the exposed metal pad. The under-the-ball metal electrode has an electrode body and an electrode tail, the electrode body is located at a bottom portion of the under-the-ball metal electrode and is in contact with the metal pad, and the electrode tail is located at a top portion of the under-the-ball metal electrode. Further, the IC packaging structure includes a solder ball formed on the under-the-ball metal electrode.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
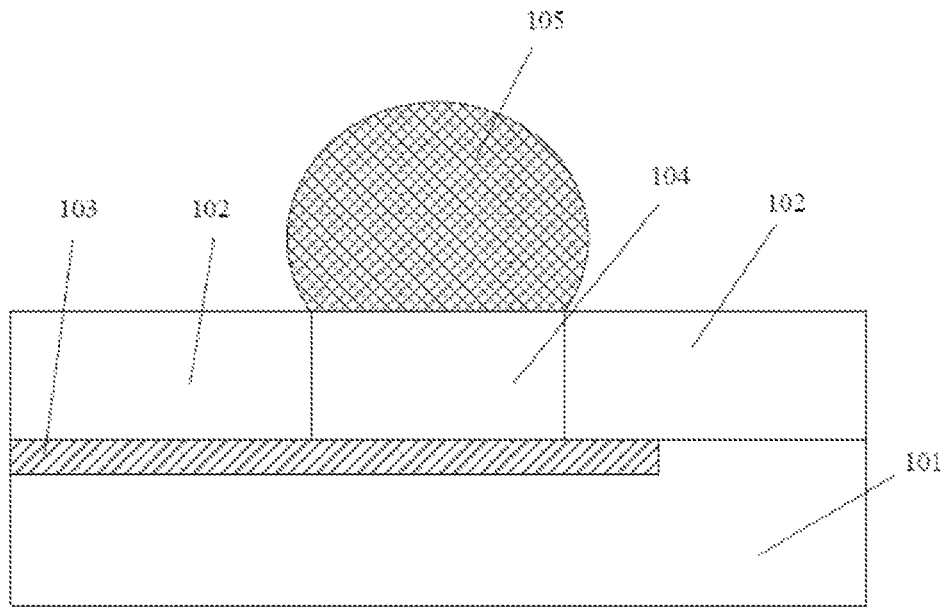
FIG. 1 illustrates an existing packaging structure.
Figure 2:
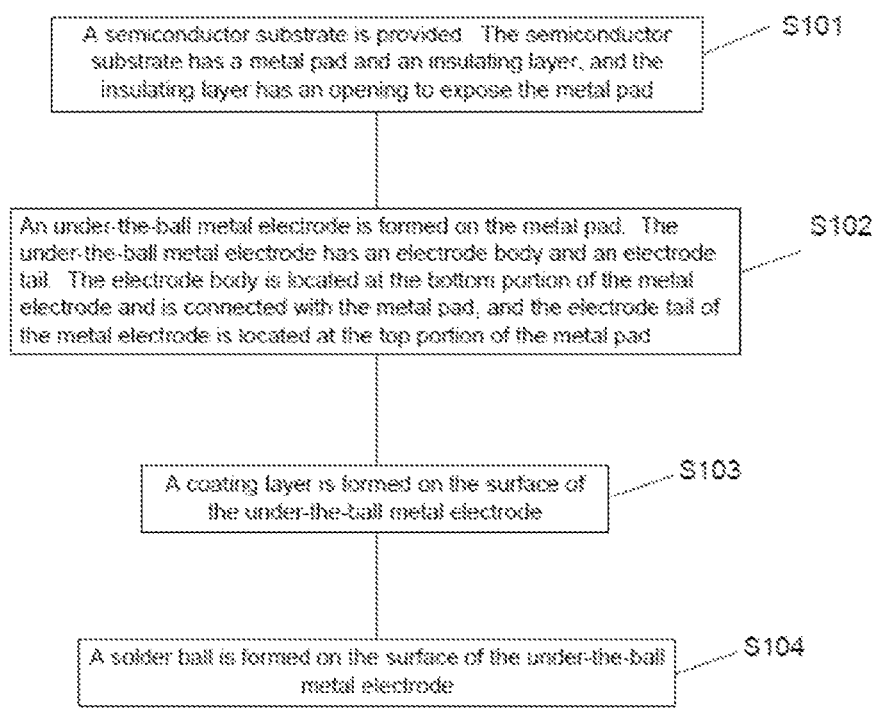
FIG. 2 illustrates a flow diagram of an exemplary packaging process consistent with the disclosed embodiments.

FIG. 2 illustrates a flowchart of an exemplary packaging process consistent with the disclosed embodiments. FIGS.

3-7 illustrate packing structures corresponding to certain stages of the packing process.

Figure 3:
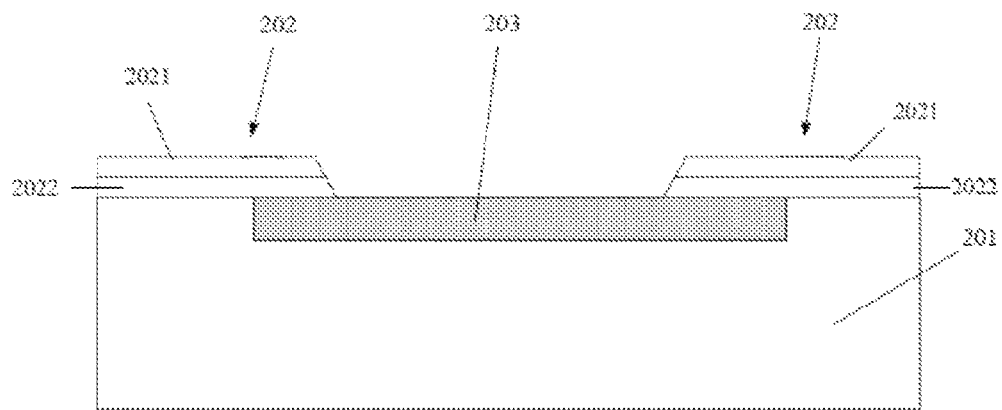
FIGS. 3-7 illustrate exemplary packaging structures corresponding to various steps in the packaging process consistent with the disclosed embodiments.

As shown in FIG. 2, at the beginning of the packaging process, a semiconductor substrate is provided (Step S101). The semiconductor substrate is also referred to as a chip. The semiconductor substrate has a metal pad and an insulating layer, and the insulating layer has an opening to expose the metal pad. FIG. 3 illustrate a corresponding structure.

As shown in FIG. 3, a semiconductor substrate 201 is provided. The semiconductor substrate 201 may be a wafer of monocrystalline silicon, silicon on insulator (SOI), SiGe, or any Group III-V compound. The semiconductor substrate 201 may also include one or more dielectric layer inside or on its top surface. Further, the semiconductor substrate 201 may include other semiconductor devices, metal interconnect, or other semiconductor structures formed thereon.

Further, a metal pad 203 is formed inside the semiconductor substrate 201 and an insulating layer 202 is formed on top of the semiconductor substrate 201. The insulating layer 202 has an opening exposing the metal pad 203.

The insulating layer 202 may include a passivation layer 2021 and a polymer layer 2022. The passivation layer 2021 may be formed to protect the metal pad 203, to provide electrical isolation, and to form the opening to expose the metal pad 203. The passivation layer 2021 may be made of silicon oxide, silicon nitride, or a low K material.

The polymer layer 2022 is formed on the passivation layer 2021, and also has the opening for exposing the metal pad 203. The polymer layer 2022 may be made of Polyimide, Epoxy resin (Epoxy), or Benzocyclobutene resin (Benzocyclobutene).

The metal pads 203 may be a top interconnect metal electrode of the semiconductor substrate 201. The metal pad 203 may be made of gold, copper, aluminum, or silver, etc.

In one embodiment, the semiconductor substrate 201 is monocrystalline silicon, and the semiconductor substrate 201 also includes other semiconductor devices, metal interconnect, and other semiconductor structures. The insulating layer 202 includes a silicon oxide passivation layer and a polyimide polymer layer. Further, the insulating layer 202 has an opening exposing the metal pad 203, and the metal pad 203 is a top interconnect metal electrode of the semiconductor substrate 201. The metal pad 203 is made of copper.

Returning to FIG. 2, after the semiconductor substrate 201 is provided, an under-the-ball metal electrode is formed on the metal pad 203 (Step S102). The term "under-the-ball metal electrode" may refer to the metal electrode providing connection and support for solder balls or bumps, e.g., as outputs of the system-level packaging structure.

Figure 4:
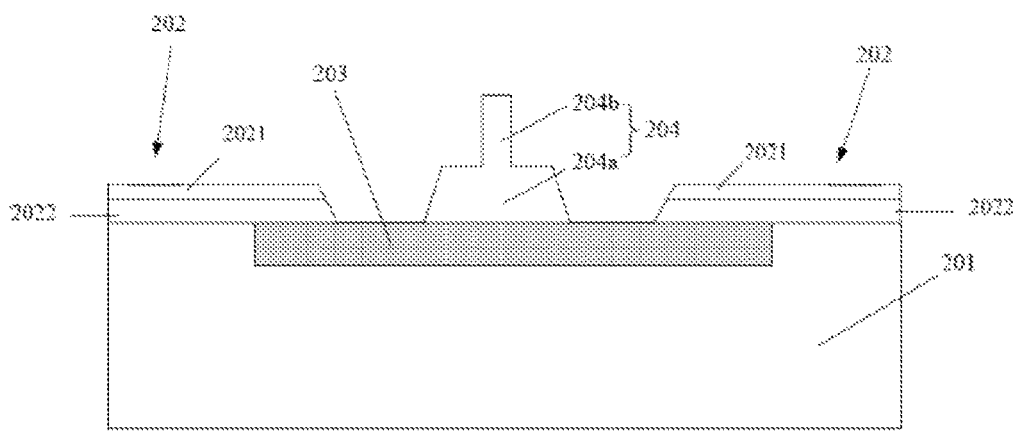

The under-the-ball metal electrode has an electrode body and an electrode tail. The electrode body is located at the bottom portion of the under-the-ball metal electrode and is in contact with the metal pad 203. The electrode tail of the under-the-ball metal electrode is located at the top portion of the under-the-ball metal electrode. FIG. 4 illustrates a corresponding structure.

As shown in FIG. 4, the under-the-ball metal electrode 204 is formed on the metal pads 203. The under-the-ball metal electrode 204 has an electrode body 204a and an electrode tail 204b. The electrode body 204a is located at the bottom portion of the metal electrode 204 and contact with the metal pad 203. Further, the electrode tail 204b is located at the top of the metal electrode 204.

The electrode body 204a is configured to connect the metal pad 203 and the subsequently-formed solder ball, and also to support the electrode tail 204b, and the electrode tail 204b can be inserted or embedded into the subsequently-formed solder ball. Thus, the contact area between the under-the-ball metal electrode and the solder ball is significantly increased, increasing the adhesion between the under-the-ball metal electrode and the solder ball. Thus, when an external force is applied on the solder ball, it is less easy for the solder ball to fall off the surface of the under-the-ball metal electrode 204.

The metal electrode 204 may be formed by a wire bonding method. A metal wire is bond onto the metal pad 203 to form the electrode body 204a, and a wire arc is formed by the metal wire to a height of the electrode tail 204b. The metal wire is then clipped off and the metal electrode 204 is formed.

In one embodiment, the process for forming the metal electrode 204 may include:
1. Putting a metal wire through the bonding head of the packaging equipment to reach the top of the metal pad 203;
2. Using an oxyhydrogen flame or a spark electric discharge system to melt the metal wire;
3. Under the surface tension, the molten metal solidifies into a metal sphere or a metal ball (ball diameter is generally 1.5-4 times of the diameter of the metal wire);
4. Lowering the bonding head down and, by applying the appropriate pressure, temperature, kinetic energy, and time period, pressing the metal ball onto the metal pads 203. During this process, by applying pressure on the metal ball through the bonding head, causing plastic deformation and atomic diffusion between the metal wire and metal pad 203, and forming the electrode body 204a;
5. Raising the bonding head, bring up the metal wire to form a wire arc to a specific height (height of the electrode tail 204b to be formed), and using the bonding clamp to cut the metal wire. The remaining metal wire on the electrode body 204a is then forming the electrode tail 204b, and the electrode body 204a and the electrode tail 204b form the under-the-ball metal electrode 204.

It should be noted that the wire bonding is a process normally used for packaging inside chips or between external leads and chips. However, as disclosed, the wire bonding process is modified to form the under-the-ball metal electrode, allowing the electrode tail to be formed at the same time as the electrode body by raising the bonding head to arc the metal wire. The packaging process is therefore simplified and the efficiency is increased.

The under-the-ball metal electrode 204 may be made of gold, copper, or silver, or an alloy containing gold, copper, or silver, etc. Other metal may also be used. The height of the electrode tail 204b may be approximately 0.005 to 1.5 times of the height of the electrode body 204a. When the height of the electrode tail 204b is less than 0.005 times of the height of the electrode body 204a, the length of the portion of the electrode tail 204b embedded into the solder ball may be limited, and the adhesion between the under-the-ball metal electrode 204 and the solder ball may also be limited.

On the other hand, when the height of the electrode tail 204b is equal to or greater than 1.5 times of the height of the electrode body 204a, electrode tail 204b may have a relatively small diameter compared with the electrode body 204a. Further, due to soft texture of the metal wire, the electrode tail 204b can be easily bended or twisted and affect the spherical shape of the solder ball, reducing yield and affect inverted chip packaging.

In one embodiment, the under-the-ball metal electrode 204 is made of copper, and the height of the electrode tail 204b is approximately the same as the height of the electrode body 204a.

Figure 5:
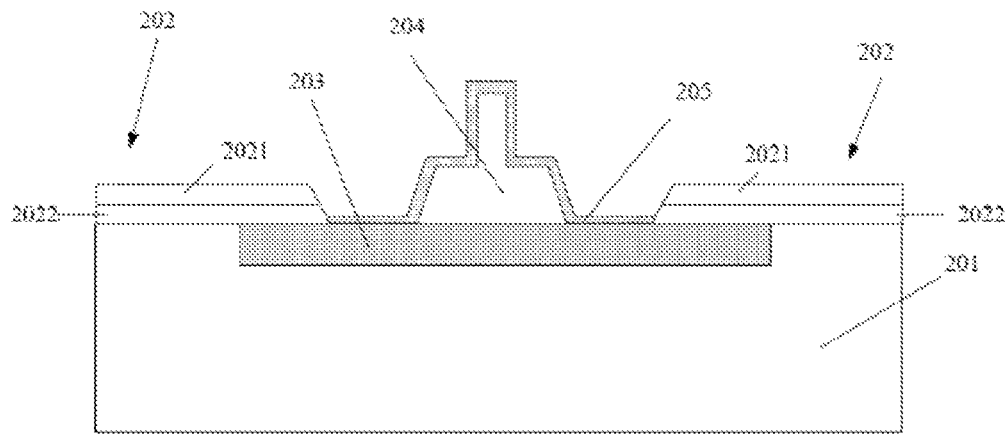
Figure 6:
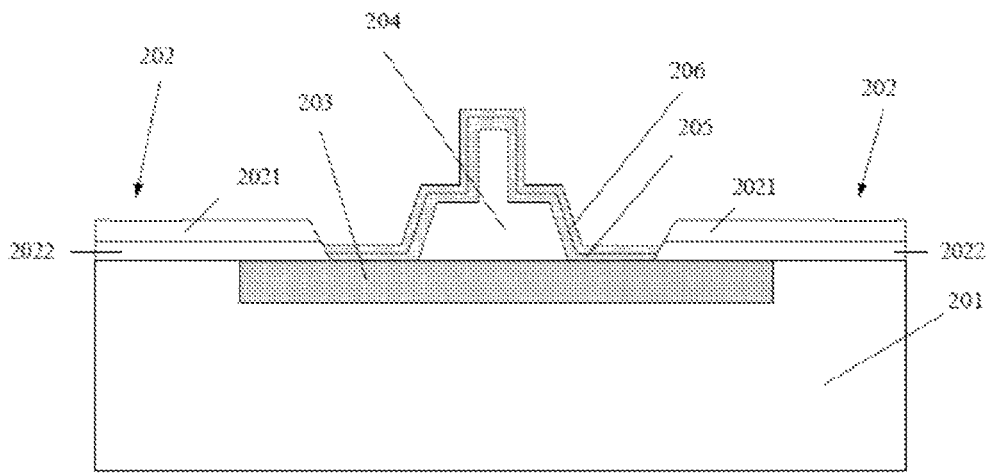

Returning to FIG. 2, after forming the metal electrode 204, a coating layer is formed on the surface of the under-the-ball metal electrode (Step S103). The coating layer may be formed on top of the metal electrode 204 and covers the metal electrode 204 as well as the exposed portion of metal pad 203. Further, the coating layer may be a stacked layer, i.e., multiple layers stacked together. For example, the coating layer may include a diffusion preventing layer and a wetting layer, where the diffusion preventing layer is formed on the surface of the metal electrode 204 and the wetting layer is formed on the diffusion preventing layer. FIGS. 5 and 6 illustrate corresponding structures.

As shown in FIG. 5, a diffusion preventing layer 205 is formed on the surface of the metal electrode 204. The diffusion preventing layer 205 also covers the exposed portion of metal pad 203.

The diffusion preventing layer 205 may be made of nickel. Comparing with the under-the-ball metal electrode 204, it may be substantially slower for the diffusion preventing layer 205 to form intermetallic compound with the solder ball. Thus, the diffusion preventing layer 205 can act as a barrier layer between the metal electrode 204 and the solder ball to prevent the formation of intermetallic compound and voids. Because intermetallic compound and voids can affect the mechanical strength and life of the solder joint, the diffusion preventing layer 205 can significantly improve the intermetallic compound issue and enhance the reliability of the chip packaging.

The diffusion preventing layer 205 may be formed by chemical plating or electroless plating. Electroless plating is performed by using an oxidation reduction reaction to obtain a metal-plated surface coating without connecting electricity. The electroless plating can form a uniform coating using simple plating equipment, and does not require power supply and the anode. The formed diffusion preventing layer 205 may have a thickness of approximately 0.05 μm to 5 μm. The thickness of the diffusion preventing layer 205 may also be related to the chip packaging process. When the process temperature is lower, the thickness of the diffusion preventing layer 205 can also get smaller.

In one embodiment, before the electroless plating is performed, the under-the-ball metal electrode 204 is first prepared to remove the surface oxide film on the metal electrode 204 to reduce contact resistance. Then, a nickel plating layer is formed on the surface of the under-the-ball metal electrode 204 via the electroless plating, having a thickness of approximately 0.1 μm to 3 μm. Other thickness may also be used.

Further, as shown in FIG. 6, after the diffusion preventing layer 205 is formed, a wetting layer 206 is formed on the surface of the diffusion preventing layer 205 and covers the surface of the diffusion preventing layer 205.

In certain embodiments, the material of the diffusion preventing layer 205 is nickel, but nickel can be easily oxidized and cause increases in the interface resistance. Thus, by covering the surface of the diffusion preventing layer 205, the wetting layer 206 can prevent oxidation of the diffusion preventing layer 205.

In addition, the wetting layer 206 can provide desirable wetting effect between the diffusion preventing layer 205 and the material of the subsequently-formed solder ball, creating better adhesion. The wetting layer 206 may be made of tin, gold, or silver, or any alloy of tin, gold, or silver.

Further, the wetting layer 206 may have a thickness of approximately 0.1 μm to 10 μm, and the thickness of the wetting layer 206 is also related to the packaging process.

In one embodiment, the wetting layer 206 is made of tin (i.e., a tin layer). The tin layer is not easy to be oxidized in the air, and can provide desirable wetting effect between the diffusion preventing layer 205 and the material of the subsequently-formed solder ball, creating better adhesion. Further, the tin layer is formed by electroless plating, having a thickness of approximately 0.1 μm to 5 μm.

Figure 7:
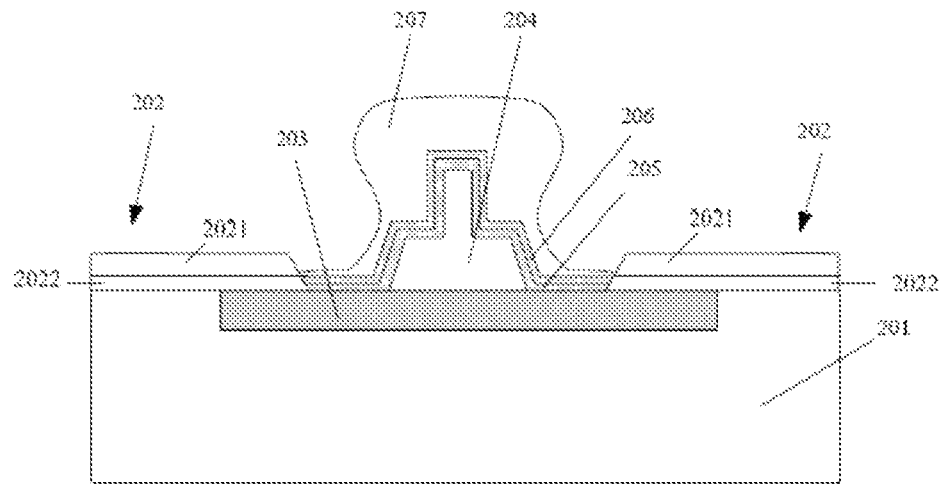

Returning to FIG. 2, after forming the coating layer, a solder ball is formed on the surface of the under-the-ball metal electrode (Step S104). FIG. 7 shows a corresponding structure.

As shown in FIG. 7, a solder ball 207 is formed on the surface of the metal electrode 204 having the coating layer. The solder ball 207 may be formed by a printing process, and the solder ball 207 may be made of tin or a tin alloy. The process of forming the solder ball (or bump) 207 may be as follows: the solder is applied by a screen on the under-the-ball metal electrode 204 with the coating layer, and a high temperature reflow is then performed. Under the surface tension effect, the solder changes to the solder ball 207. Other processes may also be used.

Figure 8:
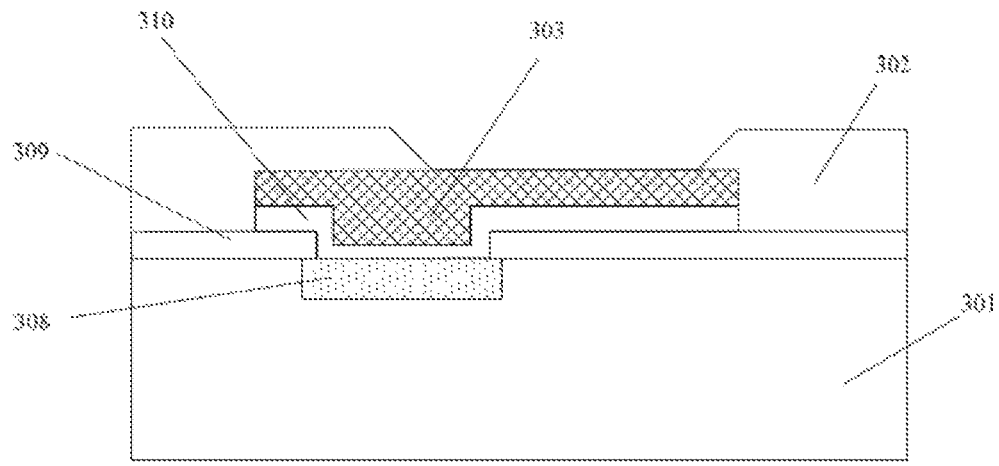
FIGS. 8-9 illustrate another packaging structure consistent with the disclosed embodiments.
Figure 9:
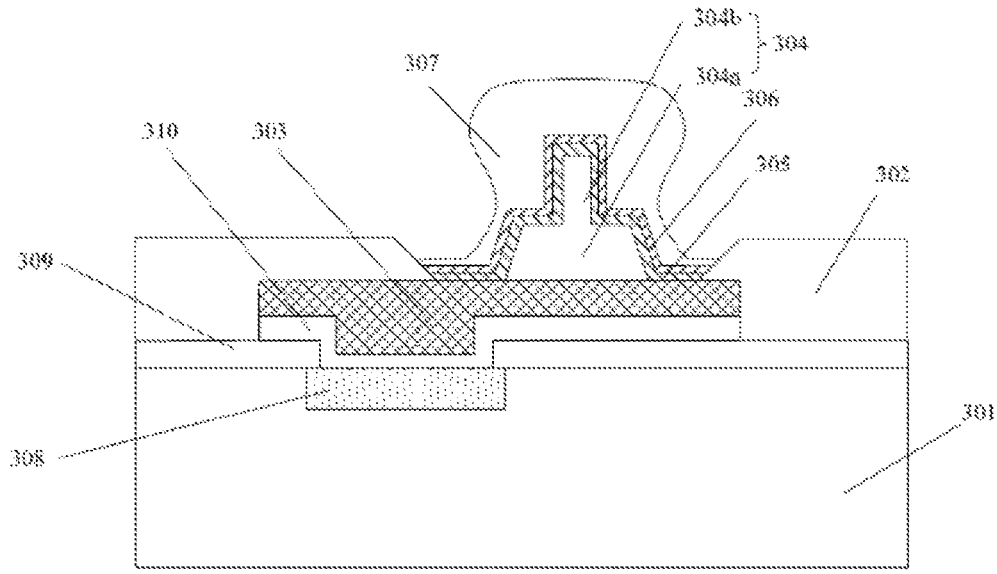

In certain embodiments, the metal pad may be a redistributed pad (RDL). FIGS. 8 and 9 illustrate an exemplary packing structure by using the RDL.

As shown in FIG. 8, a semiconductor substrate 301 is provided. The semiconductor substrate 301 includes a metal electrode 308 located within the semiconductor substrate 301, a first insulating layer 309 located within the semiconductor substrate 301 and covering a portion of the metal electrode 308.

The insulating layer 309 has a first opening exposing the metal electrode 308. A transition metal layer 310 is formed to cover the side and bottom surfaces of the first opening. The transition metal layer 310 has a second opening formed along the surface of the first opening. The semiconductor substrate 301 also includes a metal pad 303 located on the transition metal layer 310 and filling the second opening, and a second insulating layer 302 located on the metal pad 303. The second insulating layer 302 has a third opening exposing the metal pads 303.

The metal pad 303 is a redistributed pad (RDL). The redistributed pad is formed by adding on the surface of the chip with the first insulating layer 309, the transition metal layer 310, and the second insulating layer 302. According to the rules of the packaging process, the position of the redistributed pad 303 can be rearranged based on the position of the metal electrode 308 within the semiconductor substrate 301. The redistributed pad can greatly reduce the packaging size of the chip, meeting the requirements for high-density packaging and improving the data transmission speed and stability.

Referring to FIG. 9, an under-the-ball metal electrode 304 is formed on the metal pads 303, and the under-the-ball metal electrode 304 has an electrode body 304a and an electrode tail 304b, as described previously. The electrode body 304a is located under the bottom portion of the metal electrode 304 and in contact with the metal pad 303, and the electrode tail 304b is located on the top portion of the metal electrode 304.

Further, a coating layer is formed on the surface of the metal electrode 304 and covers the surface of the metal electrode 304 as well as surrounding metal pad 303 at the bottom of the opening. The coating layer has a stacked structure, including a diffusion preventing layer 305 and a wetting layer 306. The diffusion preventing layer 305 is located on the surface of the metal electrode 304, and the wetting layer 306 is located on the surface of the diffusion preventing layer 305. Finally, a solder ball 307 is formed on the surface of the metal electrode 304 with the coating layer.

Figure 10:
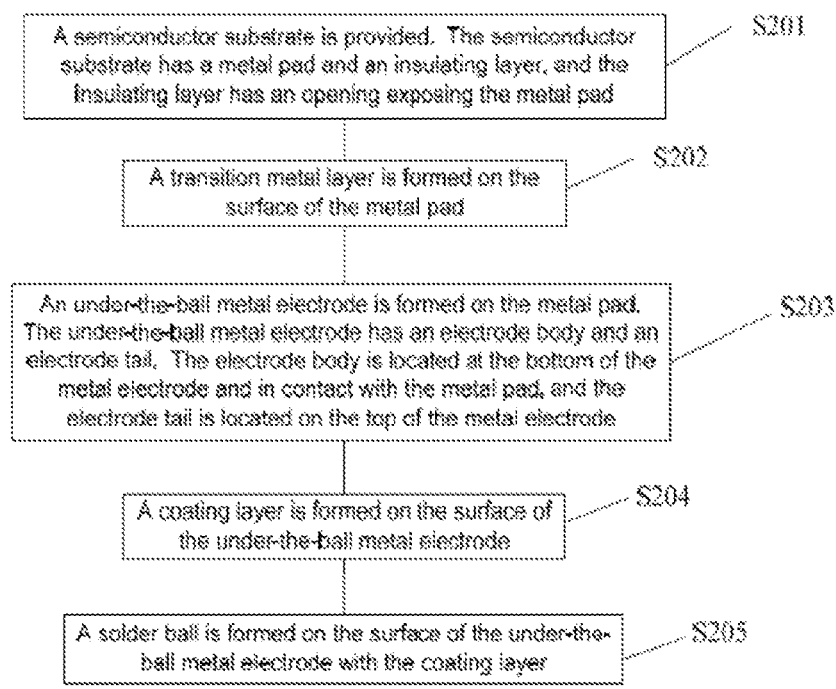
FIG. 10 illustrates a flow diagram of another exemplary packaging process consistent with the disclosed embodiments.
Figure 11:
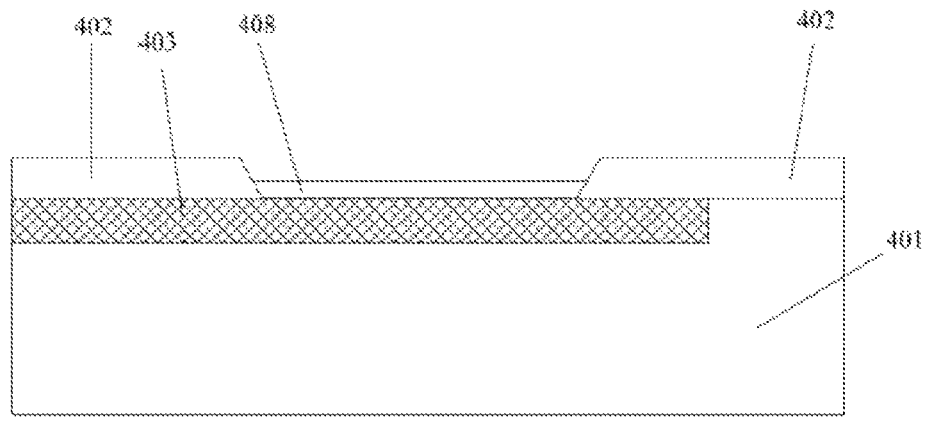
FIGS. 11-12 illustrates exemplary packaging structures corresponding to the another packaging process consistent with the disclosed embodiments.
Figure 12:
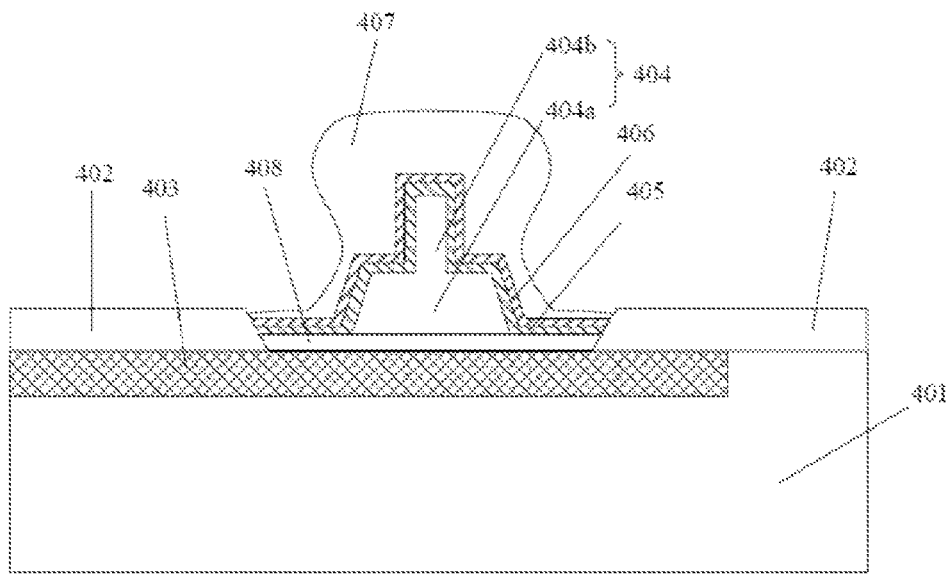

FIG. 10 illustrates a flow diagram of another packaging process consistent with the disclosed embodiments. FIG. 11 and FIG. 12 illustrate corresponding packaging structures. The differences between this packaging process and the packaging process shown in FIG. 2 include forming a transition metal layer on the metal pad before forming the under-the-ball metal electrode.

As shown in FIG. 10, at the beginning of the packaging process, a semiconductor substrate is provided (Step S201). The semiconductor substrate has a metal pad and an insulating layer, and the insulating layer has an opening exposing the metal pad.

Referring to FIG. 11, a semiconductor substrate 401 is provided. The semiconductor substrate 401 has a metal pad 403 in the semiconductor substrate 401. The insulating layer 402 has an opening to expose the metal pad 403. The metal pad 403 may be an interconnect metal electrode on top of the semiconductor substrate 401 or a redistributed metal pad.

After the semiconductor substrate 401 is provided, a transition metal layer is formed on the surface of the metal pad (Step S203).

Referring FIG. 11, a transition metal layer 408 is formed on top of the metal pad 403. The transition metal layer 408 may provide diffusion prevention, increased adhesion, and protection for the metal pad 403. The transition metal layer 408 may be formed by any appropriate process, such as a physical vapor deposition, a chemical vapor deposition, an electrochemical deposition, or an electroplating process, etc.

In certain embodiment, the transition metal layer 408 may be a NiPdAu layer, an Ag layer, a Ti layer, a Ta layer, a TiN layer, a TaN layer, a Cu layer, or a Cu alloy layer, or any combination of thereof. Further, the transition metal layer 408 may have a thickness of approximately 0.1 μm to 3 μm. The thickness of the transition metal layer 408 may be determined based on the chip's packaging size. The smaller the chip's packaging size, the smaller the thickness of the transition metal layer 408.

In one embodiment, the transition metal layer 408 is made of TiN, and the transition metal layer 408 has a thickness of approximately 0.2 μm to 1.5 μm.

After forming the transition metal layer 408, the under-the-ball metal electrode is formed on the metal pad 403 (Step S203). The under-the-ball metal electrode has an electrode body and an electrode tail. The electrode body is located at the bottom portion of the under-the-ball metal electrode and in contact with the metal pad 403, and the electrode tail is located on the top portion of the under-the-ball metal electrode.

Referring to FIG. 12, an under-the-ball metal electrode 404 is formed on the surface of the transition metal layer 408. The under-the-ball metal electrode 404 has an electrode body 404a and an electrode tail 404b. The electrode body 404a is located at the bottom portion of the under-the-ball metal electrode 404 and in contact with the metal pad 403, and the electrode tail 404b is located on the top portion of the under-the-ball metal electrode 404.

Further, a coating layer is formed on the surface of the under-the-ball metal electrode (Step S204), and a solder ball is formed on the surface of the under-the-ball metal electrode with the coating layer (Step S205).

Referring to FIG. 12, a coating layer is then formed on the surface of the metal electrode 404 and covers the surface of the metal electrode 404 as well as surrounding metal pad 403 at the bottom of the opening. The coating layer is a stacked structure, including a diffusion preventing layer 405 and a wetting layer 406. The diffusion preventing layer 405 is located on the surface of the metal electrode 404, and the wetting layer 406 is located on the surface of the diffusion preventing layer 405. Finally, a solder ball 407 is formed on the surface of the metal electrode 404 with the coating layer.

By using the disclosed methods and structures, the under-the-ball metal electrode can be formed using a wire bonding process, and the under-the-ball metal electrode has an electrode body and the electrode tail. When forming the solder ball, the electrode tail is embedded into the solder ball, significantly increasing the contact area between the solder ball and the under-the-ball metal electrode and the adhesion between the solder ball and the under-the-ball metal electrode. Thus, when an external force is applied on the solder ball, the solder ball will not easily fall off the surface of the under-the-ball metal electrode.

Further, the wire bonding process is modified to form the under-the-ball metal electrode, allowing the electrode tail to be formed at the same time as the electrode body by raising the bonding head to arc the metal wire. The packaging process is therefore simplified and the efficiency is increased.

In addition, the under-the-ball metal electrode is covered by a diffusion preventing layer. The diffusion preventing layer may be made of nickel and is substantially slower for the diffusion preventing layer to form intermetallic compound with the solder ball. Thus, the diffusion preventing layer can act as a barrier layer between the metal electrode and the solder ball to prevent the formation of intermetallic compound and voids, significantly improving the intermetallic compound issue and enhancing the reliability of the chip packaging Thus, the disclosed methods and structures may provide many advantageous IC packaging applications. Other applications and advantages are obvious to those skilled in the art.

What is claimed is:

1. A semiconductor IC packaging method, comprising:
    providing a semiconductor substrate having a metal pad and a transition metal layer, and an insulating layer with an opening to expose one of a surface of the metal pad and a surface of the transition metal layer;
    forming an under-the-ball metal electrode having an electrode body and an electrode tail on the one of the surface of the metal pad and the surface of the transition metal layer, wherein the electrode body is located at a bottom portion of the under-the-ball metal electrode to be in contact with the one of the surface of the metal pad and the surface of the transition metal layer and the electrode tail is located at a top portion of the under-the-ball metal electrode; and
    forming a solder ball to cover at least the electrode tail of the under-the-ball metal electrode, wherein forming the under-the-ball metal electrode includes:
        forming the electrode body by bonding a metal wire onto the one of the surface of the metal pad and the surface of the transition metal layer,
        forming a wire arc by the metal wire to a height of the electrode tail, and
        cutting the metal wire to form the under-the-ball metal electrode, wherein
        a height of the electrode tail is approximately 0.005 to 1.5 times of a height of the electrode body; and
    before forming the solder ball, forming a coating layer having a diffusion preventing layer and a wetting layer on a surface of the under-the-ball metal electrode between the under-the-ball metal electrode and the solder ball, wherein the diffusion preventing layer is formed on the surface of the under-the-ball metal electrode and portions of the one of the surface of the metal pad and the surface of the transition metal layer and the wetting layer is formed to cover the diffusion preventing layer, the diffusion preventing layer and the wetting layer are in contact with sidewalls of the opening of the insulating layer.

2. The semiconductor IC packaging method according to claim 1, wherein:
the diffusion preventing layer is a nickel plating layer formed by an electroless plating with a thickness of approximately 0.1 μm to 3 μm.

3. The semiconductor IC packaging method according to claim 1, wherein:
the wetting layer is formed by chemical plating and has a thickness of approximately 0.05 μm to 10 μm.

4. The semiconductor IC packaging method according to claim 1, wherein:
the insulating layer includes a passivation layer and a polymer layer;
the passivation layer is made of silicon oxide, silicon nitride, and a combination of silicon oxide and silicon nitride; and
the polymer layer is made of Polyimide, Epoxy, Benzocyclobutene, and a combination thereof.

5. The semiconductor IC packaging method according to claim 1, wherein:
the solder ball is made of tin or tin alloy through a printing process.

6. The semiconductor IC packaging method according to claim 1, wherein:
the metal pad is a redistributed pad.

7. A semiconductor IC packaging structure, comprising:
a semiconductor substrate having a metal pad and a transition metal layer;
an insulating layer formed on the semiconductor substrate with an opening to expose one of a surface of the metal pad and a surface of the transition metal layer;
an under-the-ball meal electrode with an electrode body and an electrode tail formed on the one of the surface of the metal pad and the surface of the transition metal layer, wherein the electrode body is located at a bottom portion of the under-the-ball metal electrode to be in contact with the one of the surface of the metal pad and the surface of the transition metal layer and the electrode tail is located at a top portion of the under-the-ball metal electrode; and
a solder ball formed to cover at least the electrode tail of the under-the-ball metal electrode, wherein the under-the-ball metal electrode is formed by:
forming the electrode body by bonding a metal wire onto the one of the surface of the metal pad and the surface of the transition metal layer,
forming a wire arc by the metal wire to a height of the electrode tail, and
cutting the metal wire to form the under-the-ball metal electrode, wherein
a height of the electrode tail is approximately 0.005 to 1.5 times of a height of the electrode body; and
a coating layer having a diffusion preventing layer and a wetting layer formed on a surface of the under-the-ball metal electrode between the under-the-ball metal electrode and the solder ball, wherein the diffusion preventing layer is formed on the surface of the under-the-ball metal electrode and portions of the one of the surface of the metal pad and the surface of the transition metal layer and the wetting layer is formed to cover the diffusion preventing layer, the diffusion preventing layer and the wetting layer are in contact with sidewalls of the opening of the insulating layer.

8. The semiconductor IC packaging structure according to claim 7, wherein:
the diffusion preventing layer is a nickel plating layer formed by an electroless plating process with a thickness of approximately 0.1 μm to 3 μm.

9. The semiconductor IC packaging structure according to claim 7, wherein:
the wetting layer is formed by chemical plating and has a thickness of approximately 0.05 μm to 10 μm.

10. The semiconductor IC packaging structure according to claim 7, wherein:
the insulating layer includes a passivation layer and a polymer layer;
the passivation layer is made of silicon oxide, and silicon nitride, and a combination of silicon oxide and silicon nitride;
and the polymer layer is made of Polyimide, Epoxy, Benzocyclobutene, and a combination thereof.

11. The semiconductor IC packaging structure according to claim 7, wherein:
the solder ball is made of tin or tin alloy through a printing process.

12. The semiconductor IC packaging structure according to claim 7, wherein:
the metal pad is a redistributed pad.

13. The semiconductor IC packaging method according to claim 1, wherein:
the transition metal layer has a second opening;
the metal pad fills the second opening; and
an entire top surface of the metal pad is a planar surface.

14. The semiconductor IC packaging method according to claim 1, wherein:
a cross section of the electrode body of the under-the-ball metal electrode has a trapezoid shape; and
a cross section of the electrode tail of the under-the-ball metal electrode has a rectangle shape.

15. The semiconductor IC packaging structure according to claim 7, wherein:
the transition metal layer has a second opening;
the metal pad fills the second opening; and
an entire top surface of the metal pad is a planar surface.

16. The semiconductor IC packaging structure according to claim 7, wherein:
a cross section of the electrode body of the under-the-ball metal electrode has a trapezoid shape; and
a cross section of the electrode tail of the under-the-ball metal electrode has a rectangle shape.

* * * * *